(12) United States Patent
Young et al.

(10) Patent No.: US 7,960,206 B2
(45) Date of Patent: Jun. 14, 2011

(54) ADJUSTMENT OF MASKS BY RE-FLOW

(75) Inventors: Trevor Lindsay Young, Botany (AU); Rhett Evans, Bulli (AU)

(73) Assignee: CSG Solar AG, Thalheim (DE)

( * ) Notice: Subject to any disclaimer, the term of this patent is extended or adjusted under 35 U.S.C. 154(b) by 1 day.

(21) Appl. No.: 12/551,329

(22) Filed: Aug. 31, 2009

(65) Prior Publication Data

US 2009/0317938 A1    Dec. 24, 2009

Related U.S. Application Data

(63) Continuation of application No. 10/569,613, filed as application No. PCT/AU2004/001217 on Sep. 9, 2004, now Pat. No. 7,592,201.

(30) Foreign Application Priority Data

Sep. 9, 2003   (AU) ................................ 2003904935

(51) Int. Cl.
*H01L 21/00* (2006.01)
*H01L 21/4763* (2006.01)
*H01L 21/311* (2006.01)

(52) U.S. Cl. .......... 438/98; 438/618; 438/696; 438/702; 257/E21.214; 257/E31.11

(58) Field of Classification Search ............... 438/98, 438/696, 702; 257/E21.214, E31.11
See application file for complete search history.

(56) References Cited

U.S. PATENT DOCUMENTS

| | | |
|---|---|---|
| 3,921,916 A | 11/1975 | Bassous |
| 3,976,524 A | 8/1976 | Feng |
| 4,015,986 A | 4/1977 | Paal |
| 4,022,932 A | 5/1977 | Feng |
| 4,174,252 A | 11/1979 | Kressel |
| 4,517,106 A | 5/1985 | Hopkins |
| 4,872,925 A | 10/1989 | McMaster |
| 5,266,125 A | 11/1993 | Rand |

(Continued)

FOREIGN PATENT DOCUMENTS

DE    3047884 A1    7/1982

(Continued)

OTHER PUBLICATIONS

Basore, P., "Pilot Production of Thin-Film Crystalline Silicon on Glass Modules," Conference Record of the 29th IEEE Photovoltaic Specialists Conference, New Orleans, Louisiana, May 19, 2002, pp. 49-52.

(Continued)

*Primary Examiner* — Hsien-ming Lee
*Assistant Examiner* — Kevin Parendo
(74) *Attorney, Agent, or Firm* — Christensen O'Connor Johnson Kindness PLLC

(57) ABSTRACT

As a step in performing a process on a structure, a hole pattern is provided in a thin layer of organic resin masking material formed over the structure to provide a process mask. A processing step is then performed through the openings in the mask, and after a processing step is completed the mask is adjusted by a re-flow process in which the structure is placed into an atmosphere of solvent vapor of a solvent of the mask material. By way of the re-flow process, the mask material softens and re-flows to reduce the size of the openings in the mask causing edges of the surface areas on which the processing step was performed to be covered by the mask for subsequent processing steps.

16 Claims, 8 Drawing Sheets

U.S. PATENT DOCUMENTS

| | | |
|---|---|---|
| 5,459,001 A | 10/1995 | Estes |
| 5,665,607 A | 9/1997 | Kawama |
| 5,994,753 A | 11/1999 | Nitta |
| 6,042,739 A | 3/2000 | Itoh |
| 6,245,191 B1 | 6/2001 | Derderian |
| 6,365,325 B1 | 4/2002 | Chiang |
| 6,380,006 B2 | 4/2002 | Kido |
| 6,518,596 B1 | 2/2003 | Basore |
| 6,900,548 B2 | 5/2005 | Hashimoto |
| 6,982,218 B2 | 1/2006 | Preu |
| 2001/0053570 A1 | 12/2001 | Kido |
| 2002/0187573 A1 | 12/2002 | Kido |
| 2003/0012869 A1 | 1/2003 | Kido |
| 2003/0029831 A1 | 2/2003 | Kawase |
| 2003/0076371 A1 | 4/2003 | Fong |
| 2003/0108822 A1 | 6/2003 | Igawa |
| 2003/0129548 A1 | 7/2003 | Kido |
| 2003/0186170 A1 | 10/2003 | Yamashita |
| 2004/0053800 A1 | 3/2004 | Zhang |
| 2004/0081909 A1 | 4/2004 | Ohnishi |
| 2004/0161943 A1 | 8/2004 | Ren |
| 2006/0292821 A1 | 12/2006 | Young |
| 2007/0007627 A1 | 1/2007 | Young |

FOREIGN PATENT DOCUMENTS

| | | |
|---|---|---|
| EP | 0930641 A2 | 7/1999 |
| FR | 1602847 | 2/1971 |
| GB | 1195944 | 6/1970 |
| GB | 1457924 | 12/1976 |
| GB | 2367788 A | 4/2002 |
| JP | 9-127675 A | 5/1997 |
| JP | 11340129 A | 12/1999 |
| WO | 99/21233 A1 | 4/1999 |
| WO | 00/72368 A1 | 11/2000 |
| WO | 01/47044 A2 | 6/2001 |
| WO | 2005/024927 A1 | 3/2005 |

OTHER PUBLICATIONS

Basore, P., "Simplified Processing and Improved Efficiency of Crystalline Silicon on Glass Modules," Proceedings of the 19th Photovoltaic Solar Energy Conference, Paris, France, Jun. 7, 2004, pp. 455-458.

"Nitric acid," Wikipedia, the free encyclopedia, <http://en.wikipedia.org/wiki/Nitric_acid> [retrieved Sep. 13, 2007], 5 pages.

Supplementary European Search Report, dated Oct. 16, 2006, issued in corresponding Application No. EP 04761255, filed Sep. 9, 2004.

Teng, K.F., and R.W. Vest, "Application of Ink Jet Technology on Photovoltaic Metallization," IEEE Electron Device Letters 9(11):591-593, Nov. 1988.

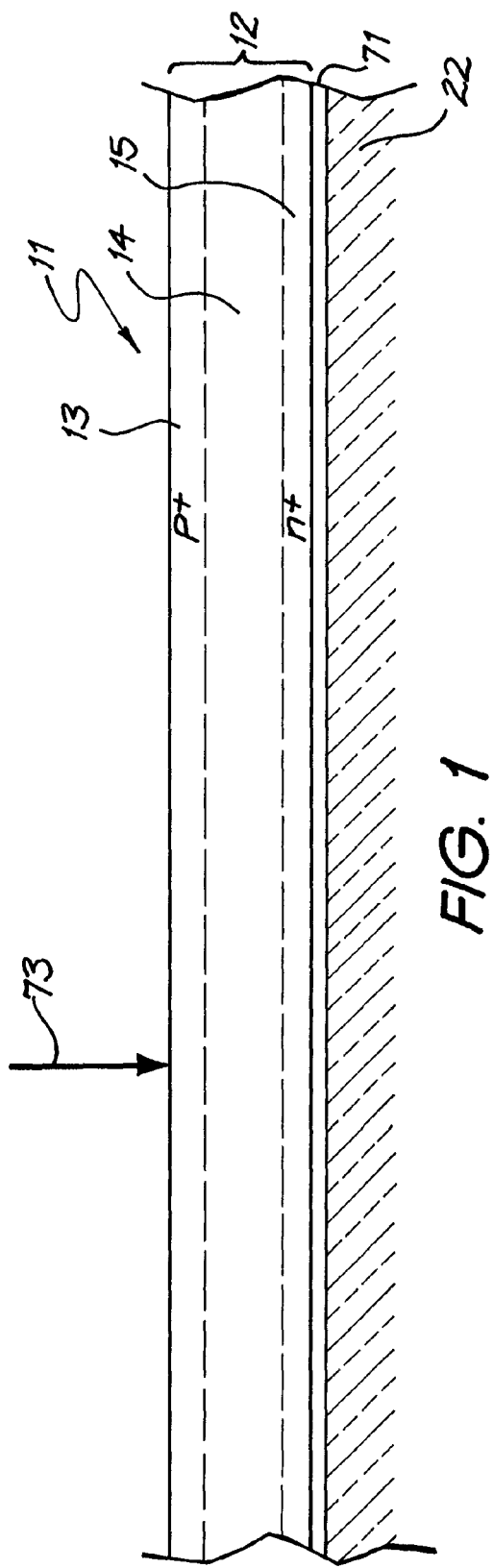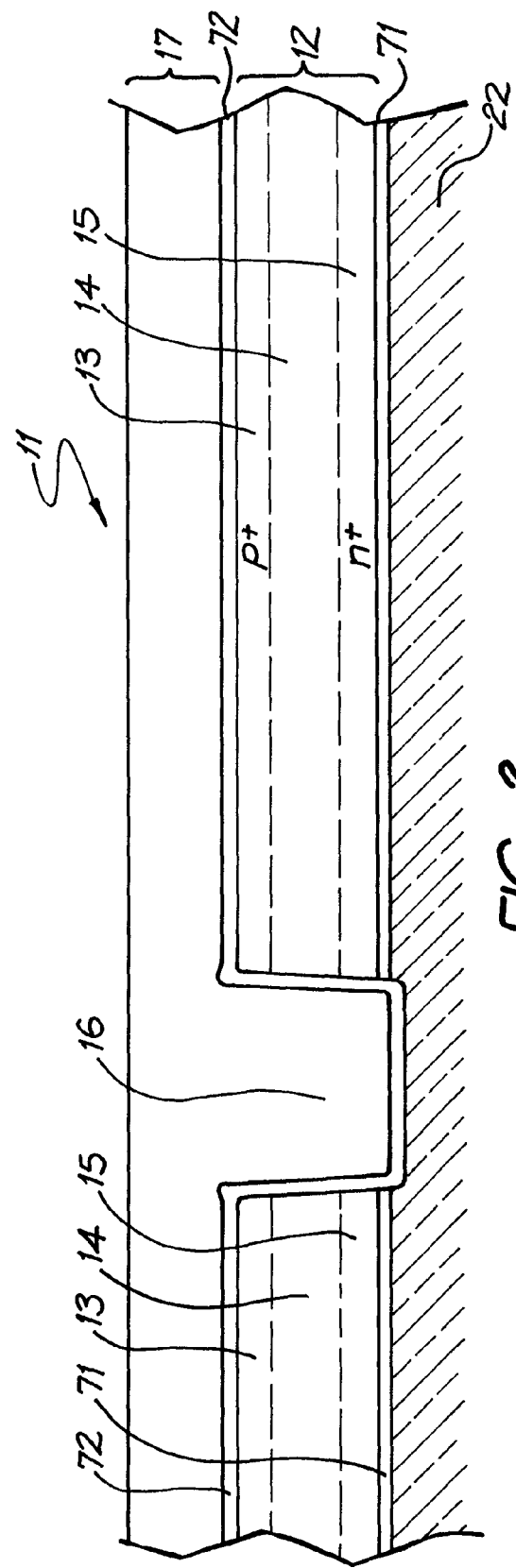

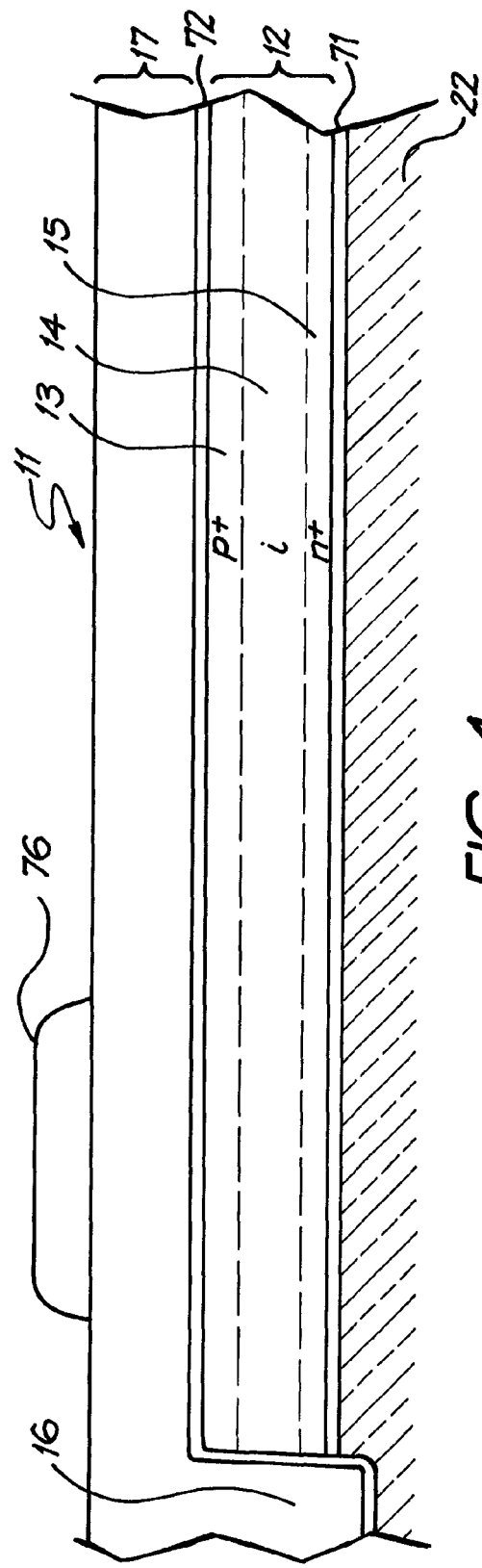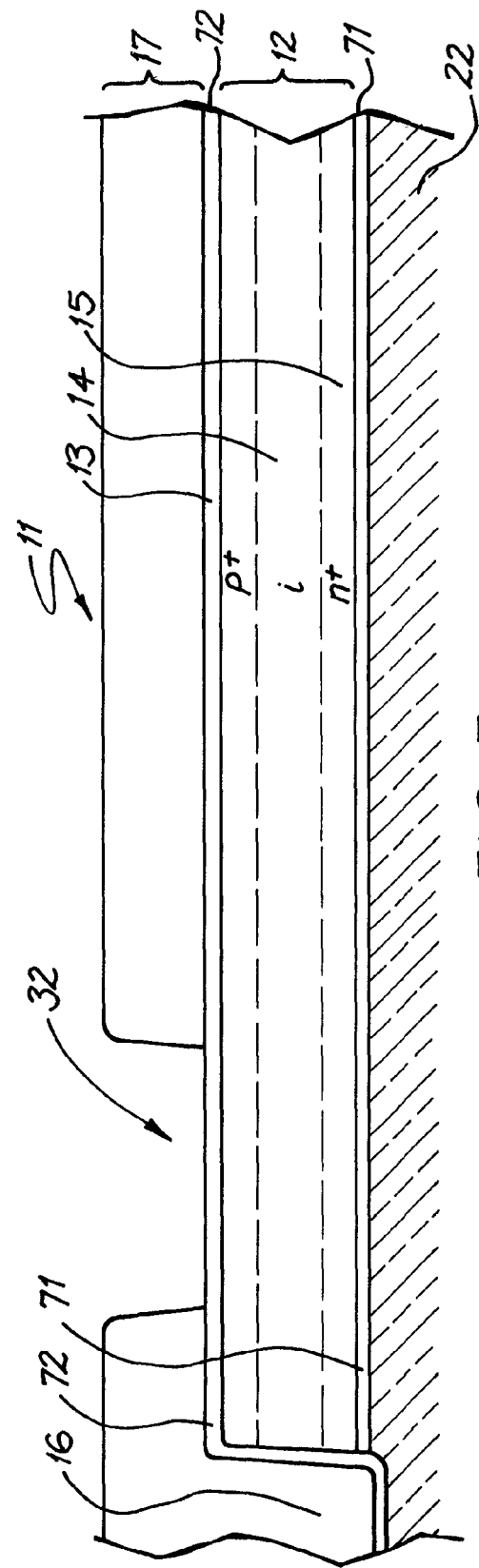

US 7,960,206 B2

ADJUSTMENT OF MASKS BY RE-FLOW

CROSS-REFERENCES TO RELATED APPLICATIONS

This application is a continuation of U.S. application Ser. No. 10/569,613, which is the National Stage of International Application No. PCT/US2004/001217, filed Sep. 9, 2004, which application is fully incorporated herein expressly by reference.

FIELD OF THE INVENTION

The present invention relates generally to the field of semiconductor device fabrication and, in particular, the invention provides an improved processing step for use in a method of forming metal contacts and other structures in thin film semiconductor devices. A new device structure for thin film photovoltaic devices is also provided.

BACKGROUND

A major advantage of thin-film photovoltaic (PV) modules over conventional wafer-based modules is the potential for low cost of production. However, in practice, cost savings have been difficult to achieve as a major component of cost is the number and complexity of process steps involved in the manufacturing sequence and can quickly outweigh savings in material costs. In particular, the number of steps that require precise alignment, or the speed of the equipment used to perform a step, can have a strong bearing on cost, as can the robustness of a process, which might in some cases lead to additional remedial steps being required or result in lower performance of the end product because of material degradation. Therefore, process improvements that reduce alignment requirement, reduce the number of steps, reduce damage to the device, or allow a step to be performed more quickly provide significant advantages.

SUMMARY

According to a first aspect, the present invention provides a method of modifying a hole pattern in an organic resin masking material formed over a structure as a step in performing a process on the structure, the method comprising the steps of:

(a) forming a mask by applying a thin layer of the organic resin (e.g., 0.1 to 10 µm) over the structure;

(b) forming openings in the mask to provide the hole pattern;

(c) performing a processing step on the surface areas of the structure exposed through the openings in the mask;

(d) placing the structure into an atmosphere of solvent vapor of a solvent of the mask material whereby the mask material softens and re-flows to reduce the size of the openings in the mask causing edges of the surface areas on which the processing step was performed to be covered by the mask for subsequent processing steps.

In preferred embodiments of the first aspect, the opening step is followed by a further processing step such as an etch, a doping step, or a coating step, and the re-flow step is performed after the further processing to modify the mask before still further processing. For example, in one embodiment, the mask is opened, an etching step is performed through the mask, the openings in the mask are reduced by re-flowing, and a contact layer is applied over the mask, which contacts the regions left uncovered by the re-flowing step but is isolated from the edges of the hole-formed by the etch.

According to a second aspect, the present invention provides a method of forming a photovoltaic device structure in a silicon film deposited on a glass substrate, the film comprising an $n^+$ type region closest the glass, a lightly doped region over the $n^+$ type region, and a $p^+$ type region over the lightly doped region, the method comprising the steps of:

1. dividing the silicon film into a plurality of cell regions by forming isolation grooves;
2. forming a mask of organic resin in a thin layer (e.g., 0.1 to 10 µm) over the silicon film;
3. forming a first set of openings in the mask in locations where n type contacts are required;
4. etching the silicon film in the first set of openings to expose at least some of the $n^+$ type silicon;
5. placing the substrate into an atmosphere of solvent vapor of a solvent of the mask material whereby the mask material softens and re-flows to reduce the size of the first openings in the mask;
6. forming a second set of openings in the mask in locations where p type contacts are required;
7. forming a metal layer over the surface of the mask and extending the metal into the first and second openings to contact the $n^+$ type and $p^+$ type silicon;
8. forming isolation grooves in the metal to separate the contacts to the p type and n type silicon within each cell.

Preferably, the method of the second aspect further includes the step of etching the silicon film in the second set of openings to remove damaged material from the surface of the $p^+$ type silicon before formation of the metal layer.

Preferably, also before forming the mask of organic resin material over the silicon film in the second aspect, a tough, thin, cap layer of silicon nitride is formed on the silicon surface.

Further in the second aspect, an anti-reflection layer is preferably formed on the glass substrate before the silicon film is deposited.

The organic resin is preferably novolac, but other similar resins are also suitable such as commonly available photoresists. The openings in the resin layer can be formed by chemical removal using solutions of caustic substances such as potassium hydroxide (KOH) or sodium hydroxide (NaOH). In a preferred method according to the invention, droplets of dilute (15%) potassium hydroxide are dispensed at locations intended for opening the mask. The KOH solution is preferably deposited using ink-jet print technology. Other methods of making openings in the mask layer include laser ablation and photographic techniques (using photoresist).

In a preferred embodiment, the re-flow step is performed by passing the supporting structure or substrate through a zone containing the vapor of the solvent at room temperatures (e.g., 21° C.). This causes the organic resin to re-flow, shrinking the size of the openings. As the samples exit this zone, they are preferably heated to drive out the remaining solvent.

The rate of re-flow will vary with the aggressiveness of the solvent used, the concentration, and temperature. There are many suitable volatile solvents that will dissolve organic resins such as novolac, including substances such as acetone. Acetone is a suitable solvent for the process but acts quite aggressively, requiring only a few seconds to achieve significant re-flow. Greater accuracy can be achieved by using a less aggressive solvent and, where the resin is novolac, the preferred solvent is propylene glycol monomethyl ether acetate (PGMEA). In the preferred arrangement, the supporting structure or substrate is introduced into an atmosphere containing a saturated vapor of PGMEA for 4 minutes until a slight shrinkage of the holes in the resin is observed.

In the case of PGMEA, the heating step is under heat lamps at a temperature of 90° C.

The re-flowing step may also be used-to close pin holes existing in the mask to prevent them from interfering with a further step or a device operation of a finished device. The re-flowing step may also be used to totally close the openings made in the opening step following the further processing.

The preferred method of forming the openings in the mask layer comprises the method of depositing a reactive material onto the surface of the mask layer in a predetermined pattern, the method comprising:

(a) placing the structure on a stage;

(b) locating an ink-jet print device over the structure and in close proximity thereto, the ink-jet device and stage being moveable relative to one another;

(c) supplying the ink-jet device with the reactive material;

(d) moving the structure and the ink-jet device relative to one another under control of control means; and (e) controlling the ink-jet device to deposit predetermined amounts of the reactive material onto a surface of the mask in the predetermined pattern as the structure and the ink-jet device move relative to one another.

Preferably, the stage is an X-Y stage and the ink-jet device is fixed, such that relative motion of the structure and the print head is achieved by moving the stage under the ink-jet device.

In embodiments where the organic resin is novolac or a similar resin, such as commonly available photoresists, the caustic solution is preferably a solution such as potassium hydroxide (KOH) or sodium hydroxide (NaOH). In a preferred method according to the invention, the solution is a 15% potassium hydroxide solution. Preferably, also glycerol is added to the solution in a suitable amount to provide the correct viscosity for the ink-jet device.

The ink-jet device may be, for example, an ink-jet print head model 128ID, 64ID2, or 64-30 manufactured by Ink Jet Technology Inc. These heads require solution viscosities of 5 to 20 centipoise.

Preferably, the steps of etching silicon through the mask comprise the method of applying a dilute solution of hydrofluoric acid (HF) and potassium permanganate (KMnO4) to the silicon surface exposed through the mask to thereby etch the silicon to a desired depth. This solution is chosen because it etches silicon without damaging novolac resin.

Preferably, the area of silicon to be etched has a width and length that are significantly greater (say by at least an order of magnitude) than the depth to be etched. In preferred embodiments, the silicon to be etched is a thin film of silicon on a foreign substrate and the etch is limited by the silicon being etched substantially down to the substrate. However, the process can also be made to progress at a rate, which allows depth of etch to be controlled by timing of the etch.

Preferably, the dilute solution of HF and KMnO4 comprises a solution of 1% HF and 0.1% KMnO4. With this solution, 1.5 µm of silicon will substantially etch away in 12 minutes at room temperature (21° C.).

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 1 is a diagram of a section through a semiconductor device after initial steps of applying an anti-reflection coating over a glass substrate and depositing a doped semiconductor film over the anti-reflection coating;

FIG. 2 is the sectional view seen in FIG. 1 after a scribing step has been completed to form a cell separating groove dividing separate cell areas and insulating layers have been applied over the semiconductor layer;

FIG. 4 is the sectional view seen in FIG. 2 (shifted slightly to the left) after a pattern of etchant has been directly deposited onto the insulating layer to open the insulating layer in areas where contacts to an underlying $n^+$ type region of the semiconductor layer are required;

FIG. 5 is the sectional view seen in FIG. 4 after the insulation layer has been opened in the areas where contacts to the underlying $n^+$ type region of the semiconductor layer are required;

DETAILED DESCRIPTION

Figure 3:
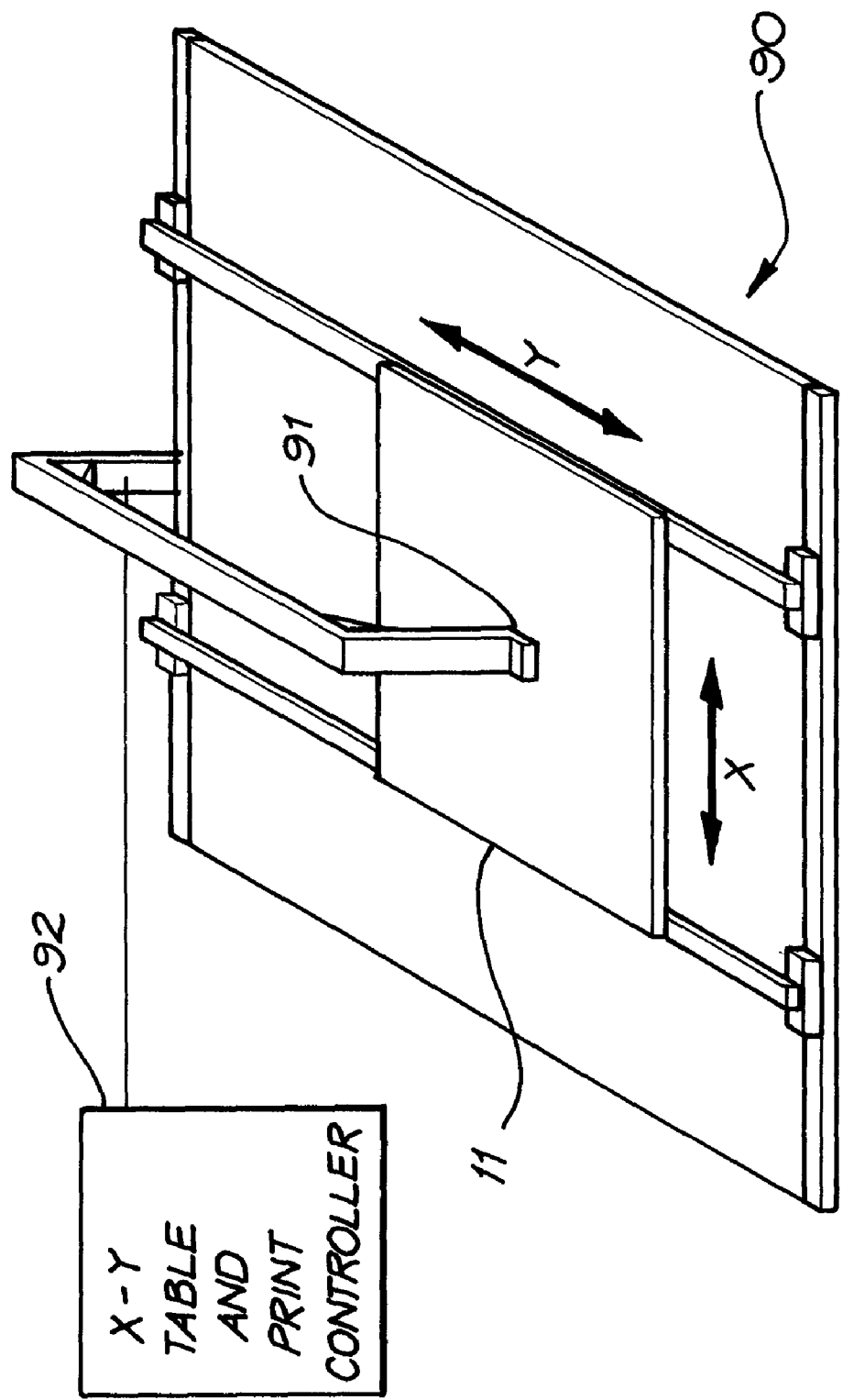
FIG. 3 is a schematic diagram of an X-Y table with an ink-jet print head fitted for directly applying the insulation etchant, using ink-jet technology.

Referring to the drawings, FIG. 1 illustrates a part of a semiconductor structure 11, which is a precursor to the photovoltaic device fabrication process described below. The semiconductor structure 11 is formed as a thin semiconductor film applied to a substrate 22 in the form of a glass sheet to which a thin silicon nitride anti-reflection coating 71 has been applied. The anti-reflection coating 71 has a thickness of 80 nm. For optimal performance, the thin semiconductor film comprises a thin polycrystalline silicon film 12 formed with a total thickness in the range of 1 to 2 µm and, preferably, 1.6 µm. The polycrystalline silicon film 12 has an upper $p^+$ type region 13, which is 60 nm thick, a lower $n^+$ type region 15, which is 40 nm thick, and a 1.5 µm thick intrinsic or lightly p type doped region 14 separating the p+ and n+ type regions. The sheet resistance in both n+ type and p+ type layers is preferably between 400 and 2500Ω/□, with no more than $2\times10_{14}$ cm$_{-2}$ boron in total. Typical values are around 750Ω/□ for n+ type material and 1500Ω/□ for p+ type material. The thickness of the n+ type and p+ type layers is typically between 20 and 100 nm. The glass surface is preferably textured to promote light trapping, but this is not shown in the drawings for sake of clarity.

Division into Cells

As seen in FIG. 2, the silicon film 12 is separated into cells by scribed isolation grooves 16. This is achieved by scanning a laser over the substrate in areas where isolation grooves 16 are required to define the boundaries of each photovoltaic cell. To scribe the grooves 16, the structure 11 is transferred to an X-Y stage (not shown) located under a laser operating at 1064 nm to produce focused laser beam 73, which cuts the isolation grooves through the silicon. The laser beam is focused to minimize the width of the groove, which is lost active area. Typically, a pulse energy of 0.11 mJ is required to fully ablate the silicon film and gives a groove width of 50 µm. To ensure a continuous groove, successive pulses are overlapped by 50%. The optimum cell width is in the range of 5 to 8 mm and cell widths of 6 mm are typical.

As seen in FIG. 2, two layers of insulation are preferably used on the surface of the silicon and are added after the laser scribing step described above. The first insulation layer is an optional thin but tough cap nitride 72. This layer protects the exposed silicon along the edges of the cell definition grooves 16 after laser scribing and passivates the surface of the silicon. The cap nitride 72 is preferably capable of being etched completely in a few minutes to allow access to the silicon at n type and p type contact locations and typically comprises 60 µm of silicon nitride deposited by PECVD at a temperature of 300° to 320° C.

Before the cap layer 72 is applied, the structure 11 is transferred to a tank containing a 5% solution of hydrofluoric acid for one minute. This removes any remaining debris and any surface oxides that may have formed. The structure is rinsed in de-ionized water and dried.

The second insulation layer 17 is a thin layer of organic resin. The insulating resin is resistant to dilute solutions of hydrofluoric acid (HF) and potassium permanganate (KMnO4) and is preferably vacuum compatible to 10-6 mbar. The insulation material most often used is novolac resin (AZ P150) similar to that used in photoresist (but without any photoactive compounds). The novolac resin is preferably loaded with 20 to 30% white titania pigment (titanium dioxide), which improves coverage and gives it a white color that improves its optical reflectivity to help trap light within the silicon. The resin layer 17 serves as an etch mask for etching steps described below and also covers over the rough jagged surface that is formed along the edges of the cell definition grooves 16, an area that is prone to pinholes in the cap nitride layer 72. The organic resin layer 17 also thermally and optically isolates the metal layer from the silicon to facilitate laser patterning of a metal layer in contact forming process steps described below.

The novolac resin is applied to each module to a thickness of 4 to 5 µm using a spray coater. After the structure 11 is coated, it is passed under heat lamps to heat it to 90° C. to cure. As seen in FIG. 2, the insulation layer 17 is applied over the cap layer 72 and extends into the cell separation groves 16.

Opening Mask and Etching N Type Contact Openings

In order to make electrical contact to the buried n+ type layer and the upper p+ type layer with a metal layer, which will be subsequently formed, holes must be made through the novolac resin layer 17 and the cap nitride layer 72 in the locations where the n type "crater" contacts and the p type "dimple" contacts are required. Firstly, with regard to the "crater" contacts to the buried n+ type silicon layer, as well as opening the novolac resin layer 17 and the cap nitride layer 72, most of the silicon film 12 must be removed from areas beneath what will later become the n type metal pads to form the n type contact openings 32. Referring to FIGS. 3, 4, and 5, ink-jet technology is used to open holes in the novolac resin layer 17 at the crater locations. To achieve this, the structure 11 is loaded onto an X-Y stage equipped with an ink-jet head 91 having multiple nozzles with a nozzle spacing of 0.5 mm and controlled by controller 92. The glass is held down with a vacuum chuck and initially scanned to ensure that no point is deformed more than 1 mm above the stage. The glass is then scanned beneath the head 91 at a table speed of typically 400 mm/s. Droplets 76 of dilute (15%) potassium hydroxide (KOH) (see FIG. 4) are dispensed at locations intended for n type "crater" contacts. The odd numbered nozzles fire in the odd-numbered cells, and the even-numbered nozzles fire in the even-numbered cells, so that within a given cell, the spacing between lines of droplets is 1 mm. The spacing between droplets within each line is 400 µm, hence the rate of droplet release at a table speed of 400 mm/s is 1 kHz. The droplets are sized to etch circular openings in the resin layer that are about 100 µm in diameter. The KOH solution removes the resin insulation 17 in the area-of the droplet 76 after a few minutes to form the hole 32 seen in FIG. 5.

The openings 32 are spaced holes so that lateral continuity is maintained in the semiconductor layer after contact formation. The ink-jet printing presses applies a droplet 76 of the caustic solution in a controlled manner to remove the insulation only where the n type contacts are to be formed. The caustic solution preferably contains potassium hydroxide (KOH) but can also use sodium hydroxide (NaOH) and includes glycerol for viscosity control. The print head used for this purpose is a model 1281D, 64ID2 or 64-30 manufactured by Ink Jet Technologies Inc., and will print substances having a viscosity in the range 5 to 20 centipoise. The droplet size deposited by the print head is in the range of 20 to 240 picolitre corresponding to a deposited droplet diameter range of 50 to 150 µm. In the preferred embodiment the droplets are printed at a diameter of 100 µm. It should be noted that novolac is an organic resin closely related to the resins used in photo-resist material and the etchant printing process described above will apply equally to the patterning of other such materials.

Figure 6:
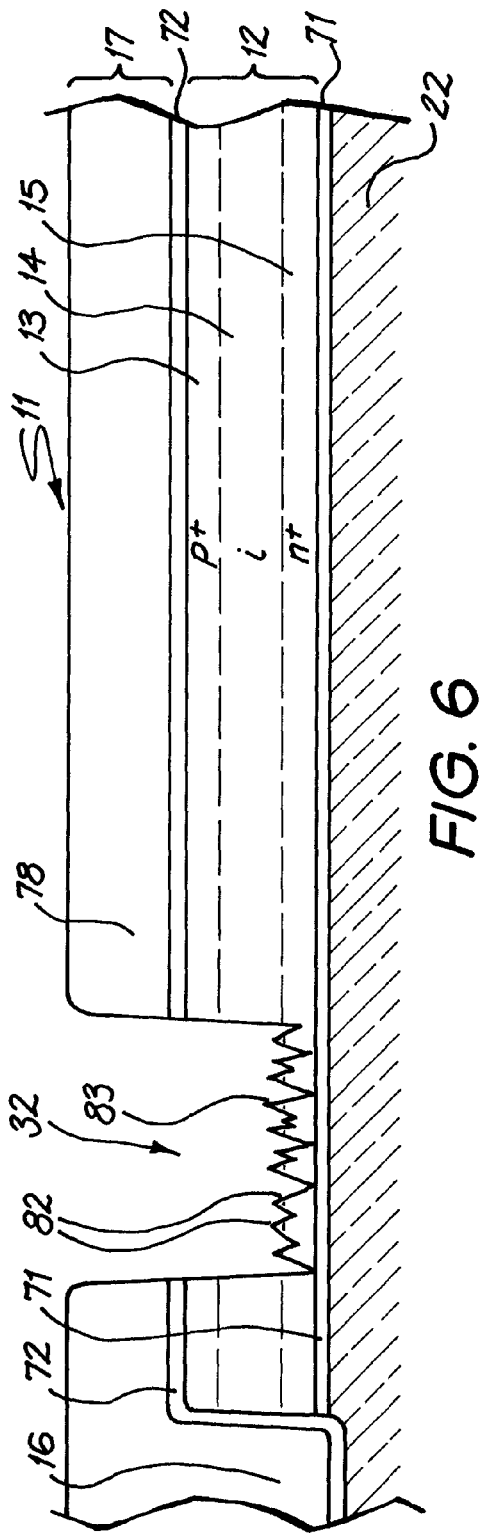
FIG. 6 is the sectional view seen in FIG. 5 after further etching steps have been performed to remove some of the doped semiconductor film in the area where the contact to the underlying $n^+$ type region of the semiconductor layer is required.

To extend the opening 32 into the silicon layer 12 as seen in FIG. 6, the structure 11 is rinsed in water to remove residual KOH from the ink-jet printing process, and it is then immersed in a tank containing a 5 solution of hydrofluoric acid for 1 minute to remove the silicon nitride from the n type contact openings 32. The sheet is then directly transferred to a tank containing 1% hydrofluoric acid (HF) and 0.1% potassium permanganate (KMnO$_4$) for 4 minutes. This time is long enough to remove all of the p+ type layer and etch down along grain boundaries to expose some of the n+ type layer for the silicon thicknesses stated above, however the time should be adjusted for different silicon layer thicknesses, silicon crystal quality, and extent of surface texturing. The structure 11 is then rinsed in de-ionized water and dried.

The resulting opening 32 in the silicon 12 has a rough bottom surface 82, in which some points may be etched through to the anti-reflection layer 71 and some ridges 83 extend into the lightly doped p type region 14, as seen in FIG. 6. However, as long as some of the n+ type region is exposed, good contact can be made to the n+ type region. Because the p type region is very lightly doped in the area near the n+ type region, there is insufficient lateral conductivity to cause shorting if some p type material is also left in the bottom of the hole 32.

Re-Flow of Mask

Figure 7:
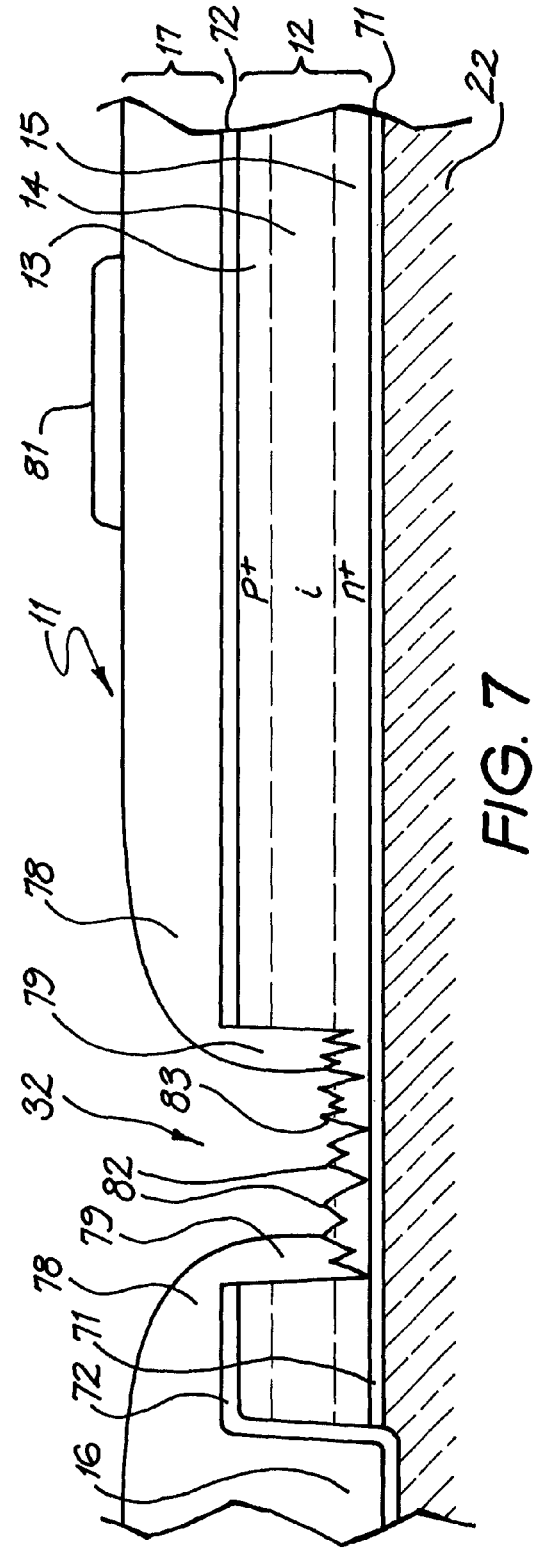
FIG. 7 is the sectional view seen in FIG. 6 after a re-flow step to flow some of the insulating layer into the hole formed by removal of some of the doped semiconductor film in the area where a contact to the underlying $n^+$ type region of the semiconductor layer are required. A pattern of caustic solution has been directly deposited onto the insulating layer to open the insulating layer in an area where a contact to an upper $p^+$ type region of the semiconductor layer is required.

Because the side walls of the hole 32 are passing through the p+ type region 13 and the lightly doped region 14, the walls need to be insulated to prevent shorting of the p-n junction. This is achieved by causing the insulation layer 17 to re-flow, whereby a portion of the insulation layer 78 in the vicinity of the edge of the opening 32 flows into the hole to form a covering 79 over the walls as seen in FIG. 7. To achieve this, the sheet is passed through a zone containing a vapor of a suitable solvent. This causes the novolac resin of the insulating layer 17 to re-flow, shrinking the size of the crater openings 32. As the samples exit this zone, they are heated under heat lamps to a temperature of 90° C. to drive out the remaining solvent.

The rate of re-flow will vary with the aggressiveness of the solvent used, the concentration and temperature. There are many suitable, volatile solvents that will dissolve organic resins such as novolac, including substances such as acetone. Acetone is a suitable solvent for the process, but acts quite aggressively, requiring only a few seconds to cover the walls of the hole 32 with resin, and making it difficult to control the process accurately. The preferred solvent is propylene glycol monomethyl ether acetate (PGMEA) and the device is introduced into an atmosphere containing a saturated vapor of PGMEA at room temperature (e.g., 21° C.) for 4 minutes until a slight shrinkage of the holes in the insulation is observed.

Opening Mask and Cleaning P Type Contact Openings

Figure 8:
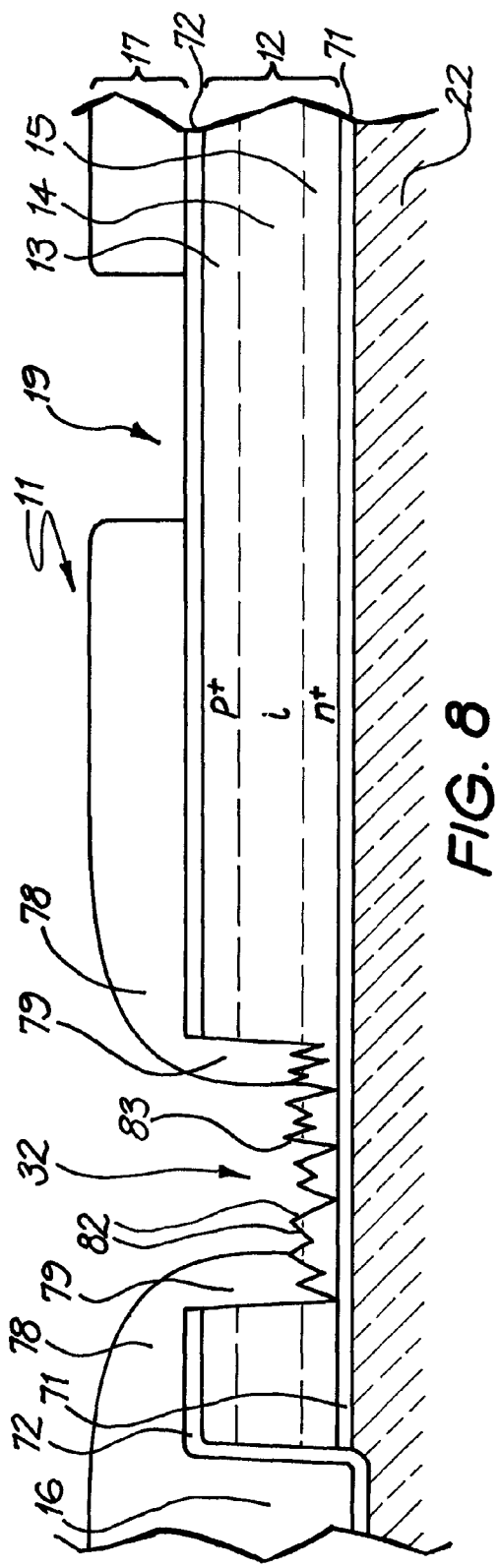
FIG. 8 is the sectional view seen in FIG. 7 after the caustic has opened the insulation layer in the areas where the contact to the upper $p^+$ type region of the semiconductor layer is required.
Figure 9:
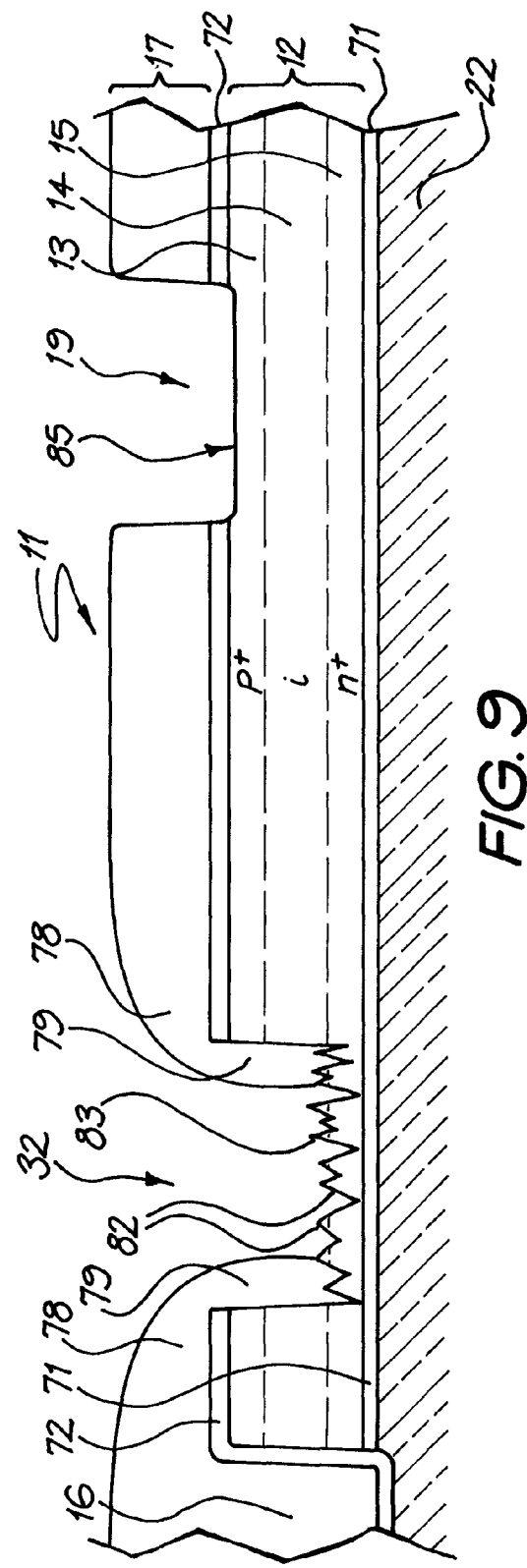
FIG. 9 is the sectional view seen in FIG. 8 after further etching steps have been performed to clean the surface of the doped semiconductor film of damaged material in the areas where the contact to the upper $p^+$ type region of the semiconductor layer is required.

A further set of holes 19 (see FIG. 8) are then formed in the insulation layer 17, again using the printing and etching process described above with reference to FIGS. 3, 4, and 5. These openings are formed by printing droplets 81 of caustic solution onto the insulation (see FIG. 7) in the locations where p type contact "dimples" are required. Following the removal of the insulation layer 17 by the caustic solution to form the openings 19 (see FIG. 8), any residual caustic solution is washed off with water and the cap layer 72 removed in the openings 19 with an etch of 5% hydrofluoric acid (HF) for 1 minute (note times of from 10 seconds to 10 minutes may be required to remove the nitride layer depending on its stoichiometry). Optionally, any damaged silicon material on the surface of the p+ type region 13 is then removed to allow good contact using an etch in 1% hydrofluoric acid (HF) and 0.1% potassium permanganate (KMnO$_4$) for ten seconds followed by a rinse in de-ionized water to provide the slightly recessed contact "dimple" 85 seen in FIG. 9. This length of etch is long enough to remove surface plasma damage without etching all the way through the p+ type layer 13. It is also short enough to have negligible impact on the n type contacts.

Formation of Metal Contacts

The final stage of device fabrication involves depositing a metal layer and slicing it up so that it form a a plurality of independent electrical connections, each one collecting current from one line of p type dimple contacts and delivering it to a line of n type crater contacts in the adjacent cell. In this manner, monolithic series interconnection of the cells is achieved.

Before the metal layer is applied, the structure 11 is immersed into a tank containing a 0.2% solution of hydrofluoric acid for 20 seconds. This acid removes the surface oxide from both the crater and dimple contacts. There is wide latitude for the strength and duration of this etch. The structure is then rinsed in de-ionized water and dried.

Figure 10:
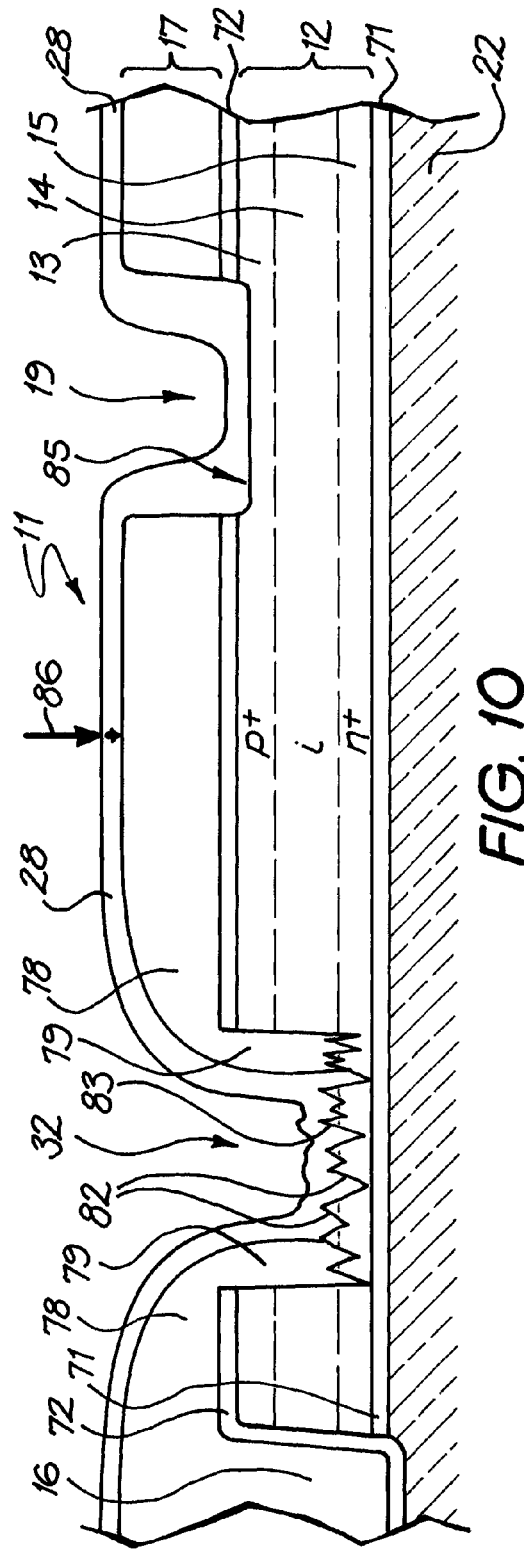
FIG. 10 is the sectional view seen in FIG. 9 after a metal layer has been applied to contact the $p^+$ and $n^+$ type regions of the semiconductor material and to interconnect adjacent cells.

Turning to FIG. 10, the contact metal for the n type and p type contacts is applied simultaneously by depositing a thin metal layer 28 over the insulation layer 17 and extending into the holes 32 and 19 to contact the surfaces 82 and 85 of the n+ type region 15 and p+ type region 13. The metal layer is preferably a thin layer of pure aluminum, which makes good electrical contact to both n+ type and p+ type silicon, provides good lateral conductivity, and has high optical reflectance. The aluminum thickness is typically 100 nm.

Isolation of N and P Type Contacts

Figure 11:
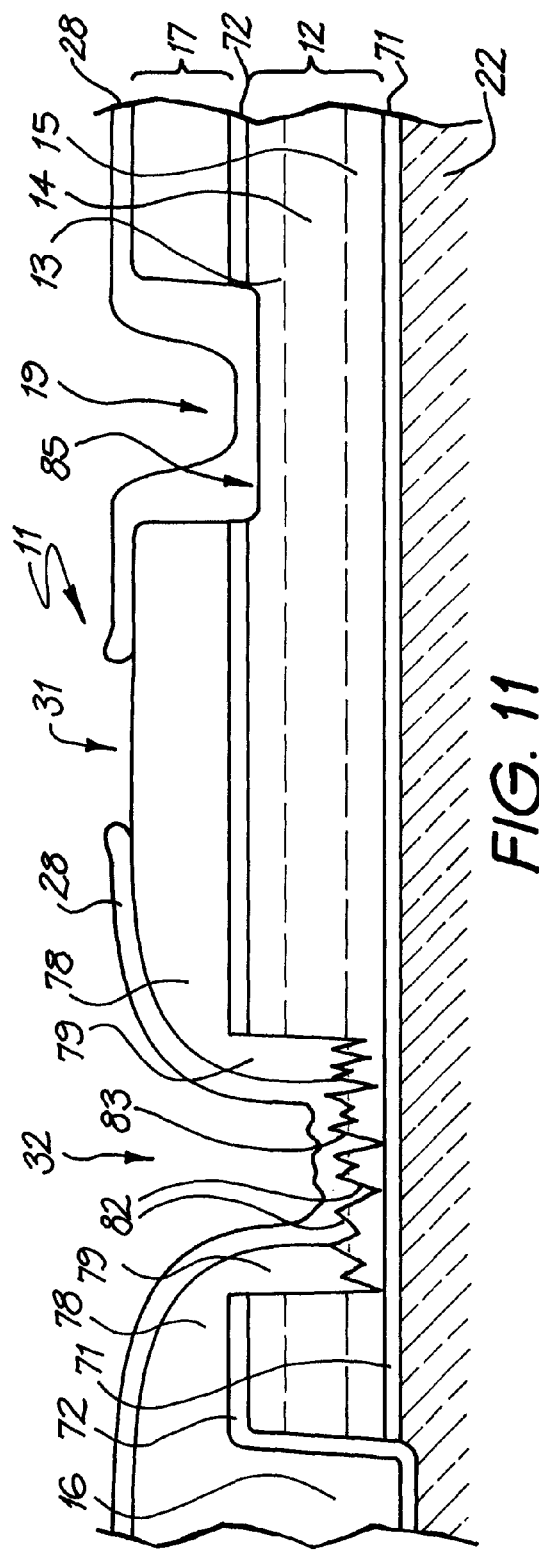
FIG. 11 is the sectional view seen in FIG. 10 after the metal layer has been interrupted to separate the contacts to the $p^+$ and $n^+$ type regions from each other within each cell.

The isolation of the n type and p type contacts is achieved by using a laser 86 (see FIG. 10) to melt and/or evaporate the metal layer 28 to thereby form an isolation groove 31, as seen in FIG. 11. When the laser is pulsed on, a small amount of metal is ablated directly under the beam creating a hole 31.

The structure 11 is processed using a laser operating at 1064 nm to scribe the isolation grooves in the metal layer 28. The laser is adjusted so that it scribes through the metal layer 28 without damaging the silicon 12. These scribes 31 separate the n type contacts 32 from the p type contacts 19 within each cell, while retaining the series connection of each cell to its neighbors. Preferred laser conditions are a pulse energy of 0.12 mJ with the beam defocused to a diameter of about 100 µm. The pulse overlap is 50% and the scribes are spaced 0.5 mm apart. In addition, there are discontinuous scribes 34 along each cell definition groove 16 (see FIG. 12).

Figure 12:
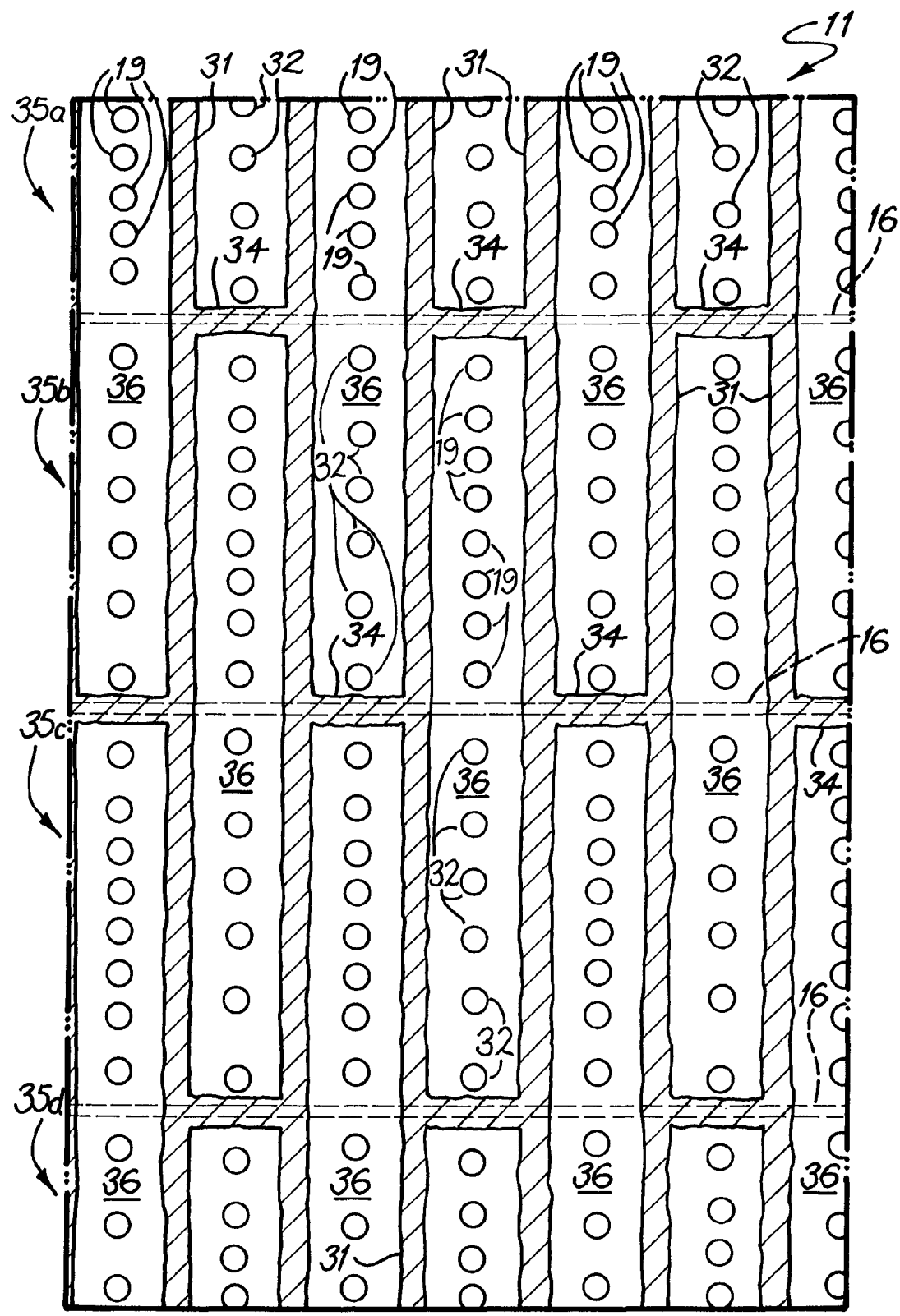
FIG. 12 is a back view (silicon side) of part of the device of FIG. 11.

FIG. 12 illustrates a rear view of a part of a device made by the process described above, from which it can be seen that each of the cells of the device 11 comprises an elongate photovoltaic element 35a, 35b, 35c, 35d divided across its long axis by a plurality of transverse metal isolation scribes 31, which isolate alternate sets of holes 19 and holes 32 respectively providing contacts to the p+ type and n+ type regions of the cell. The transverse scribes 31 are made as long substantially straight scribes extending over the length of the device, such that each scribe crosses each elongate cell.

Following the formation of the first set of scribes 31, a further set of metal isolation scribes 34 are formed over the cell separation scribes 16 between adjacent cells 11 to isolate every second pair of cells. The metal isolation scribes 34 extending to either side of any one of the elongate transverse scribes 31 are offset by one cell with respect to those on the other side of the same transverse scribe 31, such that the cells become series connected by a matrix of connection links 36 with alternating offsets, connecting one set of p type contacts 19 of one cell 35 to a set of n type contacts 32 of an adjacent cell 35, as shown in FIG. 12.

The metal isolation scribes 31 comprises a first set of long scribes transverse to the cells 35 from 50 to 200 µm wide, preferably about 100 µm wide. The scribes are typically spaced on centers of 0.2.2.0 mm and preferably about 0.5 mm to form conducting strips about 0.2-1.9 mm and preferably about 0.4 mm wide. The isolation scribes 34 comprises a second set of interrupted scribes parallel to the long direction of the cells 35 and substantially coincident with the cell isolation grooves 16 in the silicon. The isolation scribes 34 are also from 50 to 200 µm wide, preferably about 100 µm wide. It is equally possible to form the isolation scribes 34 before forming the transverse isolation scribes 31. The scribed areas are illustrated in FIG. 12 with cross-hatching.

Figure 13:
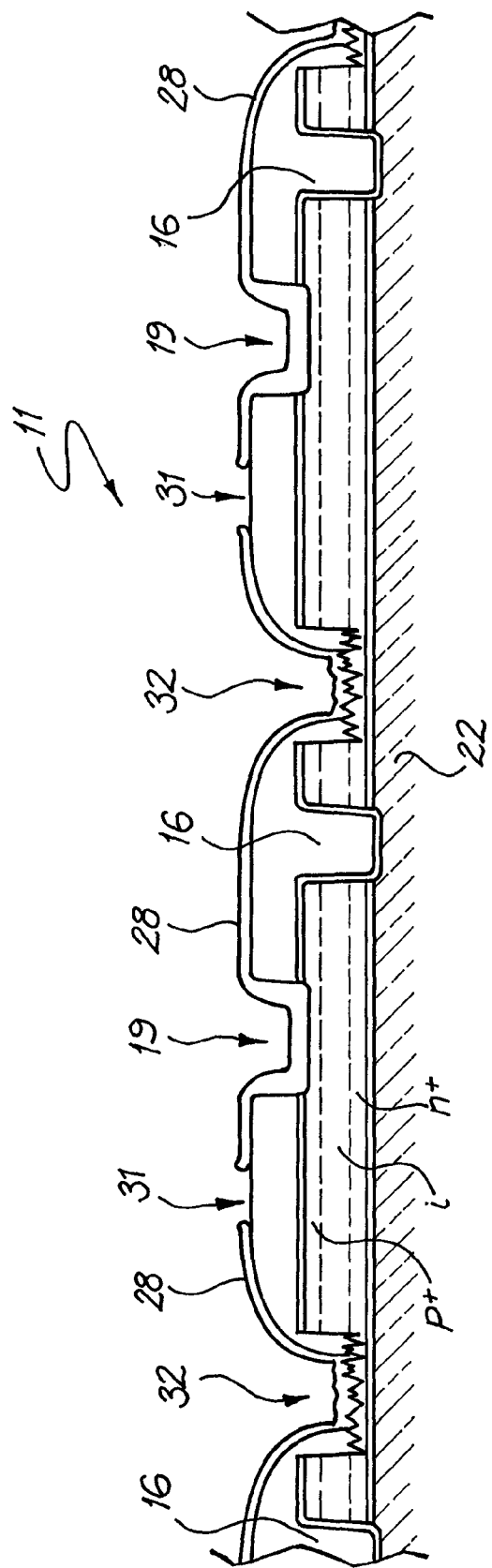
FIG. 13 is a diagram of a part of a completed device, illustrating the interconnection between adjacent cells.

A portion of the completed structure is illustrated in FIG. 13, which shows the connection of an n type contact of one cell to the p type contact of an adjacent cell to provide a series connections of cells. In practice there may be several n type contacts grouped together and several p type contacts grouped together; however, for the sake of clarity only one of each is shown in each cell. The arrangement shown is FIG. 13 is also schematic as the isolation grooves 16 in the silicon and the isolation grooves 31 in the metal run perpendicularly to one another in practice as is shown in FIG. 12.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative, and not restrictive.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method of forming a metal layer in a device, wherein the device comprises a semiconductor structure over which the metal layer is formed, wherein a first hole pattern is provided in a masking material located over the semiconductor structure, and the masking material is an organic resin formed in a layer through which a first set of openings are provided to norm the first hole pattern, the method comprising:
   (a) etching a surface of the semiconductor structure exposed by the first set of openings in the masking material;
   (b) placing the semiconductor structure into an atmosphere comprising a vapor of a solvent of the masking material, whereby the masking material softens and re-flows to reduce the first set of openings in size to thereby insulate edge regions of the etched surface; and
   (c) applying a metal layer over the masking material, such that the metal layer contacts the etched surface through the first set of openings, but is isolated from the insulated edge regions of the etched surface by the re-flowed masking material,
   whereby the metal layer provides a connection between a plurality of the etched surface regions in the device while remaining isolated from the insulated edge regions by the re-flowed masking material.

2. The method of claim 1, wherein before the formation of the application of the metal layer, a second set of openings is formed in the masking material to expose second surfaces of the semiconductor structure in each of a plurality of cells such that when the metal layer is applied over the masking material, the metal layer contacts the exposed second surfaces through the second openings, whereby the metal layer provides a connection between each of the etched surfaces in a first one of the plurality of cells and at least one of the second exposed surfaces in an adjacent cell.

3. The method of claim 2, wherein metal isolation grooves are formed in the metal layer to isolate the exposed second surfaces of the first one of the plurality of cells from the exposed second surfaces of the adjacent cell, and to isolate the etched surfaces of the first one of the plurality of cells from the etched surfaces of the adjacent cell.

4. The method of claim 1, wherein the masking material has a thickness in a range of 0.1 to 10 μm and the organic resin is novolac.

5. The method of claim 1, wherein the solvent is propylene glycol monomethyl ether acetate (PGMEA), and the re-flowing of the masking material is performed by passing the semiconductor structure through a zone containing a vapor of the solvent.

6. The method of claim 5, wherein as the semiconductor structure exits the zone containing the vapor of the solvent, the masking material is heated to drive out remaining solvent.

7. The method of claim 1, wherein the device is a photovoltaic device and the semiconductor structure is formed in a silicon film deposited on a glass substrate, the silicon film comprising a first doped region having silicon of a first dopant polarity closest to the glass substrate, a lightly doped or intrinsic region over the first doped region and a second doped region having silicon of a second dopant polarity opposite to the first dopant polarity over the lightly doped region, the method comprising:
   a) dividing the silicon film into a plurality of cell regions by forming cell isolation grooves;
   b) forming the organic resin masking material in a layer over the silicon film;
   c) forming the first set of openings in the masking material to expose the silicon of the second dopant polarity in locations where contacts to the first doped region are required;
   d) when etching the surface of the semiconductor structure through the first set of openings, exposing at least some of the silicon of the first doped region;
   e) when placing the semiconductor structure into the atmosphere comprising the vapor of the solvent of the organic resin masking material whereby the organic resin softens and re-flows to reduce each opening of the first set of openings in size and to insulate exposed edge regions of the etched surface, insulating edge regions of the second dopant polarity at edges of the exposed silicon of the first dopant polarity;
   f) forming a second set of openings in the masking material in further locations where contacts to the silicon of the second dopant polarity are required; and
   g) when applying the metal layer over the surface of the masking material, extending the metal into each opening of the first set of openings to contact the silicon of the first dopant polarity and into the second set of openings to contact the silicon of the second dopant polarity, the metal in the first set of openings being isolated from the silicon of the second dopant polarity at the edge of the exposed silicon of the first dopant polarity by the re-flowed resin;
   whereby the metal layer interconnects the silicon of the second doped region of a first one of the plurality of cells to the silicon of the first doped region of an adjacent cell.

8. The method of claim 7, wherein metal isolation grooves are formed in the metal layer to separate the contacts to the silicon of first dopant polarity from the contacts to the silicon of the second dopant polarity within each cell.

9. The method of claim 7, wherein, before applying the metal layer, the surface of the silicon of the second dopant polarity in the second set of openings is etched to remove damaged material.

10. The method of claim 7, wherein, before the silicon film is deposited, an anti-reflection layer is formed on the glass substrate and, before forming the masking material of organic resin material over the silicon film, a cap layer of silicon nitride is formed on a surface of the silicon film.

11. The method of claim 7, wherein the masking material has a thickness in a range of 0.1-10 μm and the organic resin is novolac.

12. The method of claim 7, wherein the first and second sets of openings in the masking material are respectively formed by depositing a reactive material onto the surface of the masking material in a predetermined pattern, the method comprising:

a) placing the photovoltaic device on a stage;

locating an ink-jet print device over the photovoltaic device and in close proximity thereto, the ink-jet print device and stage being moveable relative to one another;

c) supplying the ink-jet print device with the reactive material;

d) moving the photovoltaic device and the ink-jet print device relative to one another; and e) controlling the ink-jet device to deposit predetermined amounts of the reactive material. onto a surface of the masking material in the predetermined pattern of the first set of openings or the second set of openings respectively, as the structure and the ink-jet print device move relative to one another.

13. The method of claim 12, wherein glycerol is added to the reactive material to adjust a viscosity of the reactive material to be in a range of 5 to 20 centipoise.

14. The method of claim 12, wherein the stage is an X-Y stage and the ink-jet print device is fixed, such that relative motion of the photovoltaic device and the print head is achieved by moving the stage under the ink-jet print device.

15. The method as claimed in claim 7, wherein the first and second sets of openings in the masking material are formed using a solution of potassium hydroxide (KOH) or sodium hydroxide (NaOH).

16. The method as claimed in claim 15, wherein droplets of dilute (15% w/w) potassium hydroxide are dispensed at locations intended for opening the masking material.

* * * * *

UNITED STATES PATENT AND TRADEMARK OFFICE
CERTIFICATE OF CORRECTION

| | | |
|---|---|---|
| PATENT NO. | : 7,960,206 B2 | |
| APPLICATION NO. | : 12/551329 | |
| DATED | : June 14, 2011 | |
| INVENTOR(S) | : T. L. Young et al. | |

It is certified that error appears in the above-identified patent and that said Letters Patent is hereby corrected as shown below:

| COLUMN | LINE | ERROR |
|---|---|---|
| 9 (Claim 1, | 22 line 7) | "norm" should read --form-- |
| 10 (Claim 7, | 35 line 33) | "masking material." should read --masking material,-- |
| 10 (Claim 12, | 66 line 4) | "pattern." should read --pattern,-- |
| 11 (Claim 12, | 2 line 7) | Before the paragraph, insert --(b)-- |
| 11 (Claim 12, | 11 line 15) | After "material" delete "." |

Signed and Sealed this
Thirteenth Day of September, 2011

David J. Kappos
*Director of the United States Patent and Trademark Office*